United States Patent [19]
Goto et al.

[11] Patent Number: 5,155,705
[45] Date of Patent: Oct. 13, 1992

[54] SEMICONDUCTOR MEMORY DEVICE HAVING FLASH WRITE FUNCTION

[75] Inventors: Shigeki Goto; Yoshiharu Kato, both of Kasugai, Japan

[73] Assignees: Fujitsu Limited, Kawasaki; Fujitsu VLSI Limited, Kasugai, both of Japan

[21] Appl. No.: 746,011

[22] Filed: Aug. 13, 1991

Related U.S. Application Data

[63] Continuation of Ser. No. 408,013, Sep. 15, 1989, abandoned.

[30] Foreign Application Priority Data

Sep. 20, 1988 [JP] Japan .................. 63-235696

[51] Int. Cl.⁵ .................. G11C 7/00; G11C 8/00
[52] U.S. Cl. .................. 365/218; 365/230.02; 365/233; 365/238.5; 365/239; 365/194
[58] Field of Search .................. 365/189.04, 218, 222, 365/194, 230.02, 230.09, 238.5, 239, 233

[56] References Cited

U.S. PATENT DOCUMENTS

| | | | |
|---|---|---|---|
| 4,099,256 | 7/1978 | Draper | 365/230.03 |
| 4,439,843 | 3/1984 | Takamatsu | 365/218 |
| 4,489,404 | 12/1984 | Yasuoka | 365/218 |
| 4,567,578 | 1/1986 | Cohen | 365/218 |
| 4,587,629 | 5/1986 | Dill et al. | 365/218 |
| 4,680,734 | 7/1987 | Baba et al. | 365/190 X |
| 4,789,967 | 12/1988 | Liou et al. | 365/230.03 |
| 4,811,299 | 3/1989 | Miyazawa et al. | 365/233 |
| 4,873,672 | 10/1989 | Etoh et al. | 365/218 |

FOREIGN PATENT DOCUMENTS

| | | |
|---|---|---|
| 0172112 | 2/1986 | European Pat. Off. . |
| 0058691 | 4/1984 | Japan .................. 365/218 |
| 60-145595 | 8/1985 | Japan . |
| 63-106989 | 5/1988 | Japan . |

Primary Examiner—Glenn Gossage
Attorney, Agent, or Firm—Armstrong, Nikaido, Marmelstein, Kubovcik & Murray

[57] ABSTRACT

A semiconductor memory device with a flash write function includes word lines and bit lines; memory cells connected between the word lines and the bit lines; and a flash write mode designating unit for designating a flash write mode in accordance with external control signals. The semiconductor memory device further includes an internal address generating unit which is driven during a flash write mode for sequentially generating internal address signals. The semiconductor memory device additionally has a word-line selecting unit for sequentially selecting the word lines in accordance with the internal address signals from the internal address generating unit. A preset data generating unit is further included in the semiconductor memory device for generating preset data. The semiconductor memory device further has a write unit which is driven during the flash write mode for writing data from the preset data generating unit into all of the memory cells connected to the word line selected by the word-line selecting unit, wherein the flash write operation can be effected by using the internal address and without using an external address.

15 Claims, 8 Drawing Sheets

SEMICONDUCTOR MEMORY DEVICE HAVING FLASH WRITE FUNCTION

This application is a continuation of application Ser. No. 408,013 filed Sept. 15, 1989, now abandoned.

BACKGROUND OF THE INVENTION

1. Field of the Invention

The present invention relates to a semiconductor memory device and, more particularly, to a semiconductor memory device having a flash write function.

In a random access memory incorporated in a system, all bit contents are reset to "0" or "1", e.g., upon initialization or the like. In general, bits are sequentially designated and preset data is written in each bit to perform a reset operation. In this method, however, an address must be designated for each bit, and a reset time is undesirably long. In particular, this problem is serious in a RAM having a large capacity, and therefore, a flash write system for writing preset data in units of words has been proposed.

2. Description of the Related Art

The following cross references are related to the flash write system:
(i) U.S. Pat. No. 4,680,734, filed on Aug. 5, 1985, published on Jul. 14, 1987;
(ii) U.S. Pat. No. 4,587,629, filed on Dec. 30, 1983, and published on May 6, 1986;
(iii) Japanese Unexamined Patent. Publication No. 63-106989, filed on Oct. 24, 1986 and published on May 12, 1988.

In a conventional semiconductor memory device having a flash write function, for example, a given word line is designated in response to an external address signal, and preset data is simultaneously written in a plurality of memory bits connected to the given word line. In such a device, as a memory bit count per word in, e.g., a 1-Mbit (=512 cycles x 2048 bits) dynamic RAM is 2048, a reset time is given as 512 cycles, and as a result, the reset time can be shortened.

In such a conventional semiconductor memory device, however, word lines are sequentially selected in response to an external address signal, and therefore, a flash write address generator must be arranged outside the semiconductor memory device, and the external circuit is undesirably complicated.

SUMMARY OF THE INVENTION

Therefore, an object of the present invention is to provide a semiconductor memory device which can perform a flash write operation without using an external address signal.

To achieve the above object, according to the present invention, there is provided a semiconductor memory device comprising: a plurality of word lines and bit lines; a plurality of memory cells connected between the word lines and the bit lines; a flash write mode designating unit for designating a flash write mode in accordance with external control signals; an internal address generating unit, operatively connected to the flash write mode designating unit and driven during a flash write mode, for sequentially generating internal address signals; a word-line selecting unit, operatively connected to the internal address generating unit, for sequentially selecting the word lines in accordance with the internal word address signals from the internal address generating unit; a preset data generating unit, for generating preset data; and a write unit, operatively connected to the preset data generating unit and driven during the flash write mode, for writing data from the preset data generating unit into all memory cells connected to the word line selected by the word-line selecting unit.

In the above-described semiconductor memory device, the unit is a control unit having input terminals for receiving the external control signals and having an output terminal for providing a flash write mode signal when the control signals are in a predetermined state. The address generating unit has an input terminal for receiving the flash write mode signal and an output terminal for providing the word address signals when the flash write mode signal is applied to the input terminal of the address generating unit.

In the above-described semiconductor memory device, the control unit has another output terminal for providing a refresh mode signal when the control signals are in another predetermined state, and the internal address generating unit has another input terminal for receiving the refresh mode signal. The output terminal of the internal address generating unit provides the address signal when the refresh mode signal is applied to the other input terminal of the address generating unit.

The semiconductor memory further comprises: an address input buffer unit for receiving external address signals; and an address switching unit for switching the output between the external address signals from the address input buffer unit and the internal address signals from the internal address generating unit.

The control unit has discriminating unit for discriminating whether the access mode is an external address access mode or an internal address access mode based on the external control signals; whereby, when the control unit discriminates that the access mode is the internal address access mode, the address switching unit selects the internal address signals from the internal address generating unit as the address signals for accessing the memory cells, and when the control unit discriminates that the access mode is the external access mode, the address switching unit selects the external address signals from the address input buffer unit as the address signals for accessing the memory cells.

In the above-described semiconductor memory device, the control unit has an, input for receiving a column address strobe signal and has, an input for receiving a row address strobe signal. The flash write mode signal or the refresh mode signal is generated in the internal access mode in which the column address strobe signal and the row address strobe signal have a predetermined relationship. The external access mode is that in which the column address strobe signal and the row address strobe signal have a different predetermined relationship.

In the above-mentioned semiconductor memory device, the control unit comprises a first flip flop for outputting the refresh mode signal when the column address strobe signal and the row address strobe signal have the predetermined relationship and when the flash write control signal is at a first level, and comprises a second flip flop for outputting the flash write mode signal when the column address strobe signal and the row address strobe signal have the predetermined relationship and when the flash control signal is at a second level different from the first level.

According to another aspect of the present invention, the address switching unit comprises: an OR gate circuit having a first input for receiving the refresh mode signal and a second input for receiving the flash write mode signal; and a switching gate circuit for outputting the internal address signal or the external address signal in response to the output signal of the OR gate circuit.

In the above-described semiconductor memory device, the address switching unit further comprises a gate circuit for receiving an external flash write control signal and the output signal from the OR gate circuit, the output of the gate circuit being connected to the input of the switching gate circuit, whereby when the external flash write control signal is at a predetermined level, the switching gate circuit selects the external address signals to be output regardless of the levels of the refresh mode signal or the flash write mode signal.

According to still another aspect of the present invention, the address switching unit comprises: an OR gate circuit for receiving the refresh mode signal or the flash write mode signal; a first NAND gate for receiving the output of the OR gate and the internal word address signals; a first NAND gate circuit for receiving the output signal from the OR gate circuit and the internal address signal; a second NAND gate circuit for receiving an inverted signal of the output signal from the OR gate circuit and the external address signal; and a third NAND gate circuit for outputting one of the output signals from the first NAND gate circuit or the second NAND gate circuit.

According to a still further aspect of the present invention, the address switching unit comprises: an OR gate circuit for receiving the refresh mode signal or the flash write mode signal; a gate circuit having a first input connected to the output of the OR gate circuit and a second input for receiving an external flash write control signal; a first NAND gate for receiving the output of the gate circuit and the internal word address signals; a second NAND gate circuit for receiving an inverted signal of the output signal from the gate circuit and the external address signal; and a third NAND gate circuit for outputting one of the output signals from the first NAND gate circuit or the second NAND gate circuit.

According to a further aspect of the present invention, the write unit comprises a column decoder for selecting all of the bit lines when the flash write mode signal is applied to the column decoder, whereby the preset data is written into the memory cells connected between the selected word line and all of the bit lines.

In the above-described semiconductor memory device, the write unit further comprises an input/output gate circuit for passing the preset data to the memory cells, and a data switching unit for selecting the preset data from the preset data generating unit when the flash write mode signal is applied to the data switching unit, and for selecting usual write data when the flash write mode signal is not applied to the data switching unit.

According to a still further aspect of the present invention, the write unit comprises: flash write transistors each connected between each of the bit lines and ground, and a switching unit for selecting the preset data from the preset data generating unit to be written into the flash write transistors when the flash write mode signal is applied to the switching unit, and for selecting usual data to be written into the memory cells when the flash write signal is not applied to the switching unit.

According to another aspect of the present invention, the write unit comprises: a bit line control circuit connected to the bit lines, including: first transistors which are turned ON in response to a first clock signal for connecting the bit lines to a $\frac{1}{2} V_{cc}$ power source; second transistors which are turned ON in response to a second clock signal for connecting the bit lines to a $V_{cc}$ power source; and third transistors which are turned on in response to a third clock signal for connecting the bit lines to a $V_{ss}$ power source; whereby, in a reset mode, the bit lines are reset to the $\frac{1}{2} V_{cc}$ level in response to the first clock signal, and in a flash write mode after the reset mode, the bit lines are reset at the $V_{cc}$ or $V_{ss}$ level in response to the second or third clock signal. According to the present invention, when control signals are externally input, a word address signal is generated inside the device and preset data is written in a plurality of memory cells connected to a word line selected in response to the word address signal. Therefore, a flash write address generator is not required for an external circuit, and thus the external circuit is simplified.

BRIEF DESCRIPTION OF THE DRAWINGS

FIG. 1 to 7 are views showing a semiconductor memory device according to a first embodiment of the present invention, in which:

FIG. 1 is a block diagram for explaining a principle of the first embodiment,

FIG. 2 is a block diagram showing the entire arrangement of the semiconductor memory device;

FIG. 3 is a timing chart related to a refresh mode signal $S_{RF}$;

FIG. 4 is a timing chart related to a flash write mode signal $S_{FW}$;

FIG. 5 is a circuit diagram showing an arrangement of a main part of a controller;

FIG. 6 is a circuit diagram showing an arrangement of an address switching circuit; and FIG. 7 is a circuit diagram showing another arrangement of the address switching circuit;

FIGS. 8 and 9 are circuit diagrams showing a semiconductor memory device according to a second embodiment of the present invention, in which;

FIG. 8. is a circuit diagram showing an arrangement of a main part, and

FIG. 9 is a circuit diagram showing an arrangement of a sense amplifier; and

DESCRIPTION OF THE PREFERRED EMBODIMENTS

The present invention will be described hereinafter with reference to the accompanying drawings.

FIGS. 1 to 7 are views showing a semiconductor memory device according to an embodiment of the present invention. In FIGS. 1 to 7, the present invention is applied, as an example, to a dynamic random access memory (RAM).

Arranqement for Explaining Principle of First Embodiment

Figure 1:
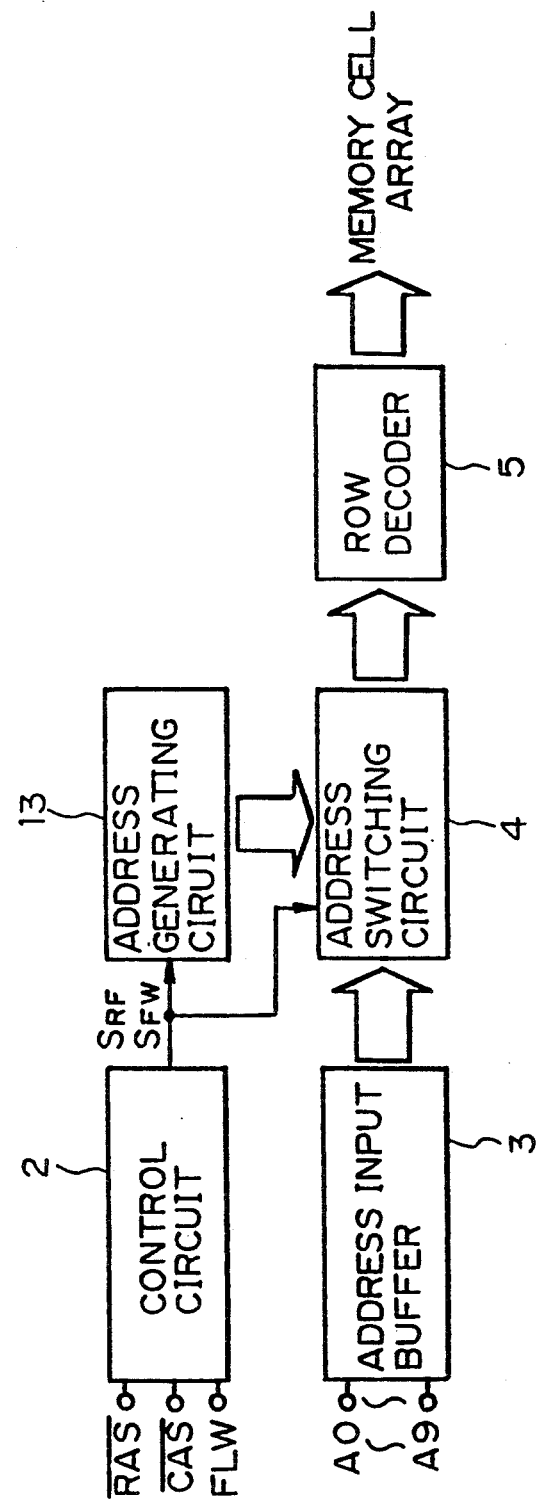

FIG. 1 is a block diagram of an arrangement for explaining a principle of the first embodiment.

In FIG. 1, 2 denotes a control circuit for receiving a row address strobe signal $\overline{RAS}$, a column address strobe signal $\overline{CAS}$, and a flash write control signal FLW for effecting a flash write mode control; 3 is a row address input buffer for amplifying an external address signal A0-A9; 13 is an address generating circuit for generating an internal address; 4 is an address switching circuit for switching between the external address and the internal address in response to a control signal from the control circuit 2; and 5 is a row decoder.

Note that the internal address generated by this address generating circuit 13 is used, according to this embodiment, for the refresh operation and for the flash write operation. In contrast, in a conventional RAM, the internal address is used only for the refresh operation, and the address for the flash write operation is supplied from an external unit.

With the arrangement shown in FIG. 1, in the flash write mode, the internal address switched by the switching circuit 4 is supplied to the row decoder 5, and therefore, a row address of a memory cell designated in accordance with the internal address is subjected to a flash write operation. Accordingly, an external flash write address is not required, and thus the external circuit can be simplified. The address generating circuit 13 has a counter which increments or decrements a count value to prepare for the next flash write operation. This operation is performed by the control circuit 2.

Figure 2:
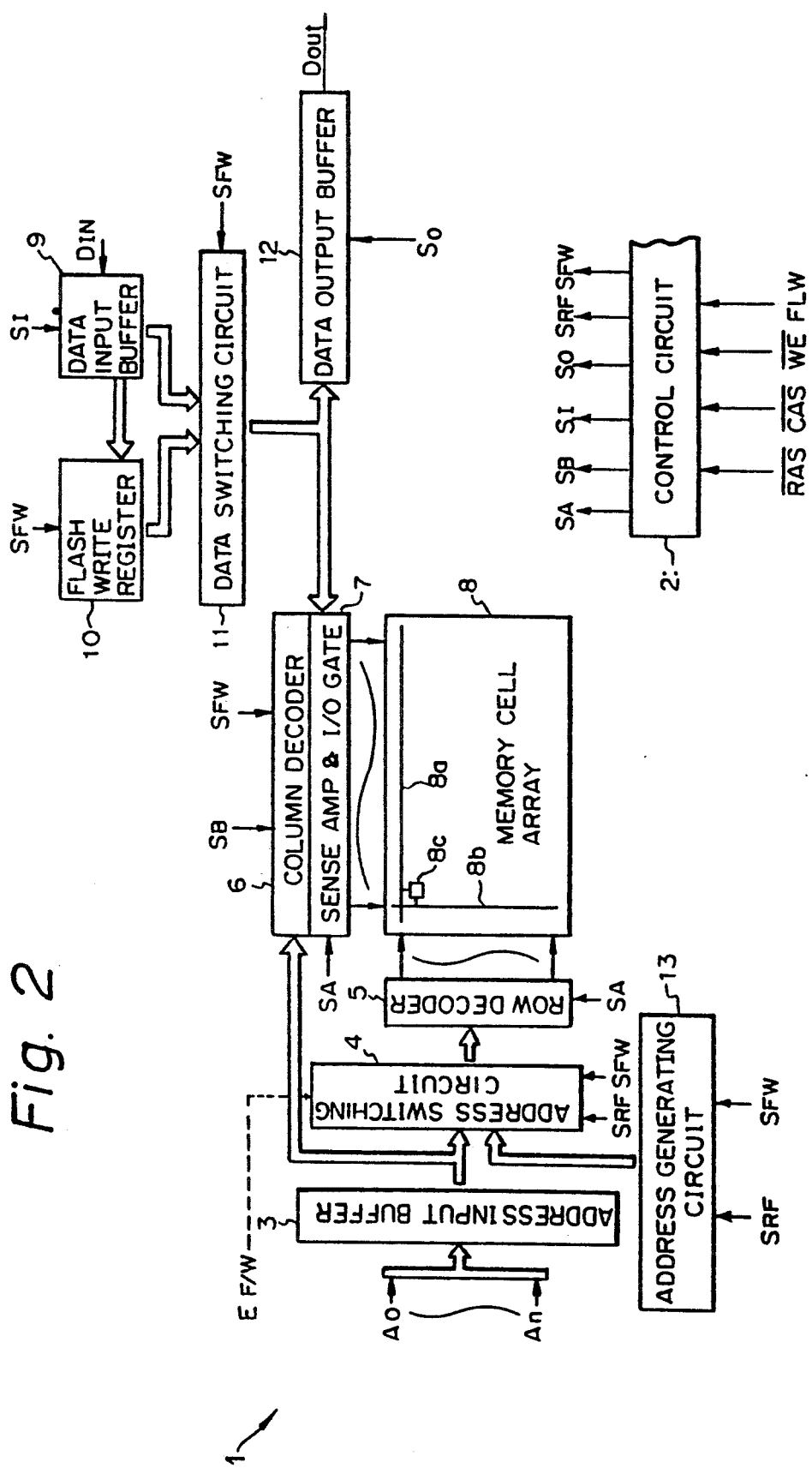

The arrangement of the circuit shown in FIG. 1 is described in more detail in the following. Referring to FIG. 2, 1 denotes a dynamic RAM which includes a control circuit 2, an address input buffer 3, an address switching circuit 4, a row decoder 5, a column decoder 6, a sense amplifier & I/O gate 7, a memory cell array 8, a data input buffer 9, a flash write register 10, a data switching circuit 11, a data output buffer 12, and an address generating circuit 13.

Symbols $\overline{RAS}$, $\overline{CAS}$, $\overline{WE}$, and FLW denote external control signals, wherein $\overline{RAS}$ is a row address strobe signal, $\overline{CAS}$ is a column address strobe signal, $\overline{WE}$ is a write enable signal, and FLW is a flash write control signal. Note that an external address flash write control signal EF/W is also one of the external control signals, in another embodiment to be described later.

The control circuit 2 receives the external control signals and generates various types of required internal control signals; for example, the control circuit 2 outputs control clock signals $S_A$ and $S_B$, a data input clock signal $S_I$, a data output clock signal $S_O$, a refresh mode signal $S_{RF}$, and a flash write mode signal $S_{FW}$.

Figure 3:
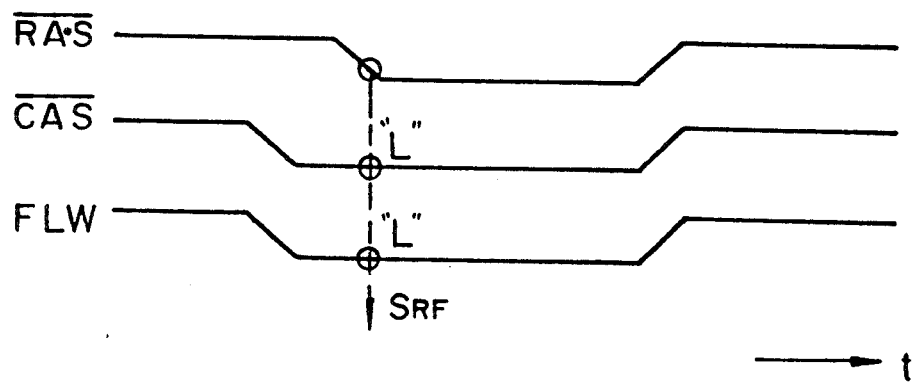
Figure 4:
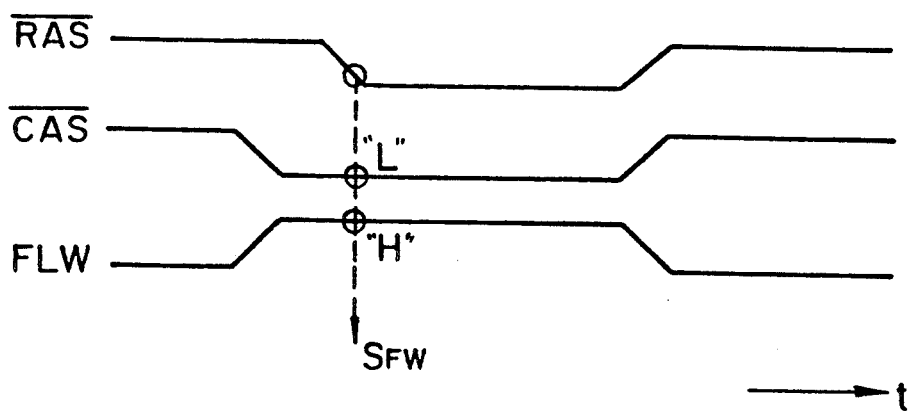

FIG. 3 is a time chart explaining when the refresh mode signal $S_{RF}$ is generated, and FIG. 4 is a time chart explaining when the flash write mode signal $S_{FW}$ is generated.

As shown in FIG. 3, the refresh mode signal $S_{RF}$ is generated when the signal $\overline{CAS}$ and $\overline{RAS}$ are in a CBR relationship in which the signal $\overline{CAS}$ becomes low (L) level before the signal $\overline{RAS}$ is made L level, and when the flash write signal FLW is at the L level. In contrast, when the signal $\overline{RAS}$ becomes L level before the signal $\overline{CAS}$ is made L level, a usual reading mode is recognized. On the other hand, as shown in FIG. 4, the flash write mode signal $S_{FW}$ is generated when the signals $\overline{CAS}$ and $\overline{RAS}$ are in the CBR relationship and when the flash write signal FLW is at the high (H) level. Accordingly, in the CBR relationship, when the signal FLW is L level, the refresh mode signal $S_{RF}$ is generated, and when the signal FLW is H level, the flash write signal $S_{FW}$ is generated. When the signals $\overline{CAS}$ and AS are not in the CBR relationship, a usual reading mode of the RAM is recognized.

Figure 5:
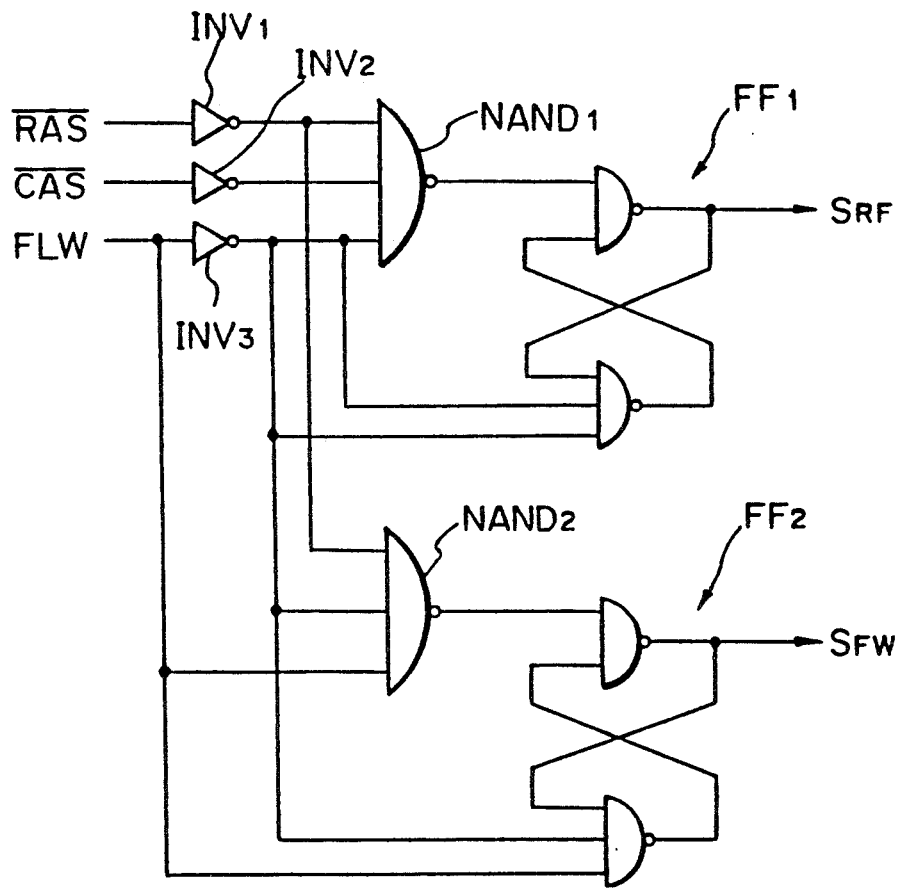

FIG. 5 is a circuit diagram showing a preferred arrangement for generating the refresh mode signal $S_{RF}$ and the flash write mode signal $S_{FW}$. The circuit shown in FIG. 5 is a main part of the control circuit 2, which includes inverters $INV_1$ to $INV_3$, 3-input NAND gates $NAND_1$ and $NAND_2$, and flip-flops $FF_1$ and $FF_2$. The flip-flop $FF_1$ is set when all of the signals $\overline{RAS}$, $\overline{CAS}$, and FLW are "L", and is reset when the signal FLW is "H". The flip-flop $FF_1$ outputs the refresh mode signal $S_{RF}$ during a set period. The flip-flop $FF_2$ is set when the signals $\overline{RAS}$ and $\overline{CAS}$ are "L" and the signal FLW is "H", and is reset when the signal FLW is "L". The flip-flop $FF_2$ outputs the flash write mode signal $S_{FW}$ during a set period. Referring again to FIG. 2, the address input buffer 3 buffers external addresses ($A_0$ to $A_n$) input by multiplexing the row and column addresses, and the external row address is output to the address switching circuit 4 and the column address is output to the column decoder 6. The address switching circuit 4 normally selects the external row address supplied from the address input buffer 3 and transmits the selected external row address to the row decoder 5. When the signal $S_{RF}$ or $S_{FW}$ is input, however, the address switching circuit 4 selects an internal address (to be described later in more detail) from the address generating circuit 13, and transmits the selected internal address to the row decoder 5. The row decoder 5 decodes the transmitted external or internal address, and selects and activates one of a large number of word lines 8a in the memory cell array 8 in accordance with the decoded result. The column decoder 6 decodes the transmitted external address, and selects one of a large number of bit lines 8b in the memory cell array 8 in accordance with the decoded result. When the flash write mode signal $S_{FW}$ is input, all of the bit lines 8b are selected, and the sense amplifier & I/O gate 7 amplifies the potentials of the selected bit lines 8b to read data from memory cells 8c connected to the selected bit lines 8b, or to write data in these memory cells 8c. The data input buffer 9 buffers external data $D_{IN}$, and supplies the data to the flash write register 10 and the data switching circuit 11. The flash write register 10 holds the supplied data, and supplies the held data to the data switching circuit 11 as preset data. The data switching circuit 11 normally selects data from the data input buffer 9. When the flash write mode signal $S_{FW}$ is input, however, the data switching circuit 11 selects the preset data from the flash write register 10, and supplies the selected data to the sense amplifier & I/O gate 7. The data output buffer 12 buffers the data read out by the sense amplifier & I/O gate 7 to output the buffered data as output data $D_{OUT}$.

The address generating circuit 13 includes an internal address counter. When the refresh mode signal $S_{RF}$ or the flash write mode signal $S_{FW}$ is input, the address generating circuit 13 sequentially increments (or decrements) refresh or flash write internal addresses for designating word lines 8a in the memory cell array 8. An initial value of the internal address may be a predetermined value or may be a value preset by the external address from the address input buffer 3. The control circuit 2 serves as a designating means for outputting the flash write mode signal $S_{FW}$ in response to the various control signals (e.g., the signals $\overline{CASRAS}$, or FLW) to designate a flash write mode. The address generating circuit 13 serves as an address generating means which is driven in the flash write mode in which the flash write mode signal $S_{FW}$ is generated, and which sequentially generates word address signals (internal addresses). The row decoder 5 serves as a selecting means for sequentially selecting word lines 8a in accordance with the word address signals (internal addresses).

The flash write register 10 serves as a data generating means for holding the external data $D_{IN}$ ("0" or "1") and outputting the "0" or "1" preset data while the data is held. The column decoder 6 and the sense amplifier & I/O gate 7 serve as writing means, driven in the flash write mode, for writing the preset data in all of the memory cells 8c connected to intersect the word lines 8a selected by the row decoder 5 as the selecting means.

Figure 6:
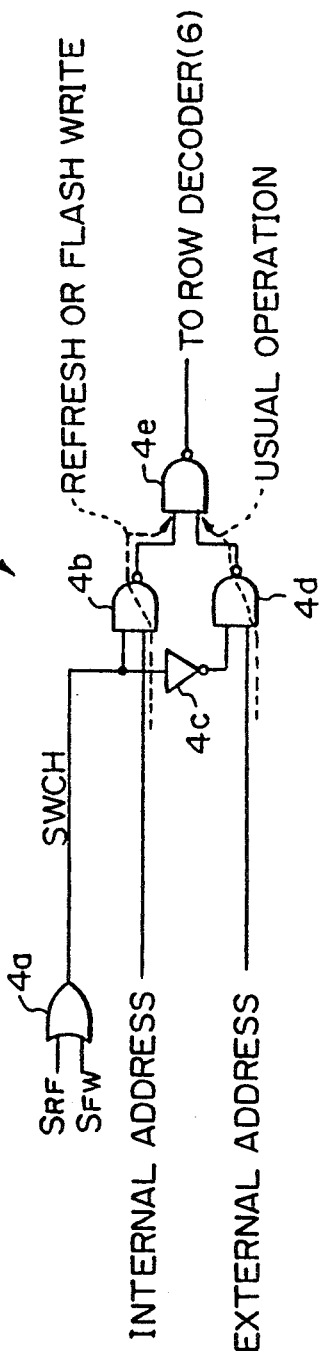
Figure 7:
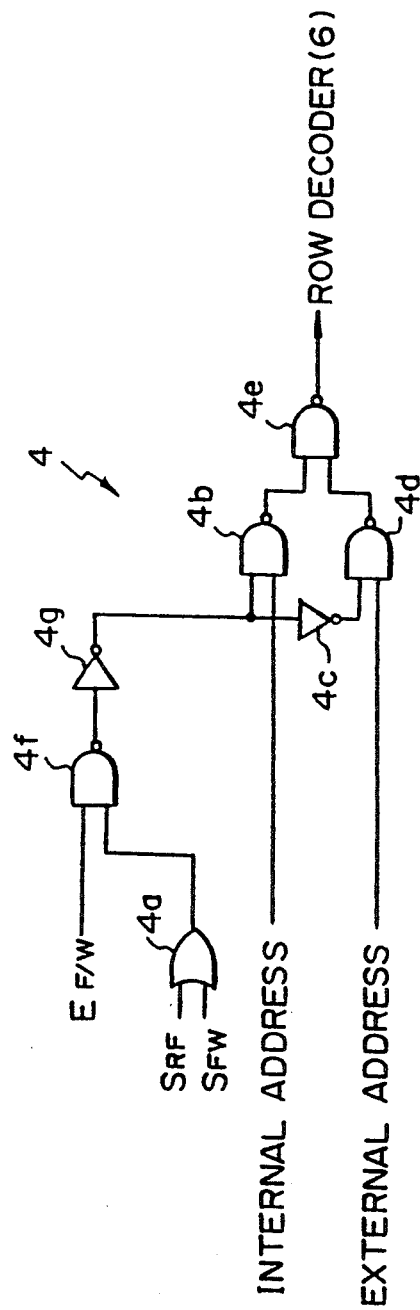

FIG. 6 is a circuit diagram showing an arrangement of the address switching circuit 4. The address switching circuit 4 includes an OR gate 4a for outputting a switching signal SWCH when the refresh mode signal $S_{RF}$ or the flash write mode signal $S_{FW}$ is input, a NAND gate 4b for passing an internal address from the address generating circuit 13 when the signal SWCH is output, an inverter gate 4c for inverting the signal SWCH, a NAND gate 4d for passing an external address from the address input buffer 3 when neither the signal $S_{FR}$ nor the signal $S_{RW}$ is input, and a NAND gate 4e for supplying the passed internal or external address to the row decoder 5. The address switching circuit 4 selects the internal address in place of the external address when the signal $S_{RF}$ or $S_{FW}$ is input, i.e., in a refresh mode or a flash write mode. Note that the above arrangement corresponds to 1 bit among a plurality of bits corresponding to the addresses $A_O$ to $A_n$.

An operation of the circuit shown in FIG. 2 will be described hereinafter.

When the signals $\overline{RAS}$, $\overline{CAS}$, and FLW have a relationship shown in FIG. 3, the refresh mode signal $S_{RF}$ is output from the control circuit 2, and the refresh mode operation is executed. In this mode, the address generating circuit 13 receives the refresh mode signal $S_{RF}$ to generate the internal address. The address switching circuit 4 selects the internal address in place of the external address. Therefore, a refresh operation is performed for each word line represented by the internal address and an external designation of a refresh address is not required.

On the other hand, when the signals $\overline{RAS}$, $\overline{CAS}$, and FLW have a relationship shown in FIG. 4, the flash write mode signal $S_{FW}$ is output from the control circuit 2, and the flash write mode is set. The address generating circuit 13 receives the flash write mode signal $S_{FW}$ to generate the internal address, and the address switching circuit 4 selects the internal address in place of the external address. When the signal $S_{FW}$ is input to the column decoder 6 and the data switching circuit 11, the column decoder 6 selects all of the bit lines 8b, and the data switching circuit 11 selects preset data from the flash write register 10, and therefore, the preset data ("0" or "1") is written in a plurality of memory cells 8c connected to one work line 8a designated in accordance with the internal address. This write operation is repeated for each word line upon an update operation of the internal address, and as a result, a reset operation is performed for each word line and the reset time can be shortened.

Therefore, in this embodiment, the dynamic RAM 1 includes the address generating circuit 13, and the address generating circuit 13 is driven not only in the refresh mode but also in the flash write mode, and accordingly, a flash write mode address generator need not be arranged outside the dynamic RAM 1, thus simplifying the external circuit. Although the internal address is forcibly used in the refresh or flash write mode in the above embodiment, the address to be used is not limited thereto, and the external address can be used as necessary. More specifically, as shown in another arrangement in FIG. 7, a NAND gate 4f and an inverter gate 4g are additionally arranged in the address switching circuit 4. The NAND gate 4f has an input terminal for receiving an external flash write control signal E F/W and another input terminal for receiving the output signal of the OR gate 4a. The output of the NAND gate 4f is inverted by the inverter 4g, and the output of the inverter 4g is connected to an input of the NAND gate 4b and to the input of the inverter 4c.

During a period when the refresh mode signal $S_{RF}$ or the flash write mode signal $S_{FW}$ is H level, when the signal EF/W is made H level, the signal $S_{RF}$ or $S_{FW}$ passes through the NAND gate 4f so that the internal address is selected by the NAND gate 4b. When the signal EF/W is made L level, the signal $S_{RF}$ or $S_{FW}$ does not pass through the NAND gate 4f, and thus the external address is selected by the NAND gate 4d.

Accordingly, the normally H level signal EF/W is supplied to an input terminal of the NAND gate 4f, and the signal EF/W is made L level as needed so that the external address can be used in the refresh or flash write mode. For example, when a specific area in the memory cell array 8 is to be refreshed or flash-written, the external address can be properly designated, thus improving the operability.

In place of the write means in the embodiment described above, the write means may be arranged as follows. More specifically, as shown in an arrangement of a main part of a second embodiment in FIG. 8, flash write transistors 20 serving as a write means are provided. Each of the transistors 20 is connected between each one of bit lines 8b in a memory cell array 8 and ground, and the gates of the flash write transistors 20 are commonly connected to a data switching circuit 21. The data switching circuit 21 includes two pairs of switching elements 21a and 21b for performing opposite operations in response to the flash write mode signal $S_{FW}$. Note that, in FIGS. 2 and 8, the same reference numerals denote the same parts. Reference symbol $T_p$ denotes a P-channel transistor operating in response to a sense amplifier drive signal $\overline{\phi_{SAP}}$, and $T_N$ denotes an N-channel transistor operating in response to a sense amplifier drive signal $\phi_{SAN}$. These transistors $T_p$ and $T_n$ supply a power source voltage $V_{cc}$ and a ground voltage to a sense amplifier SA.

Figure 9:
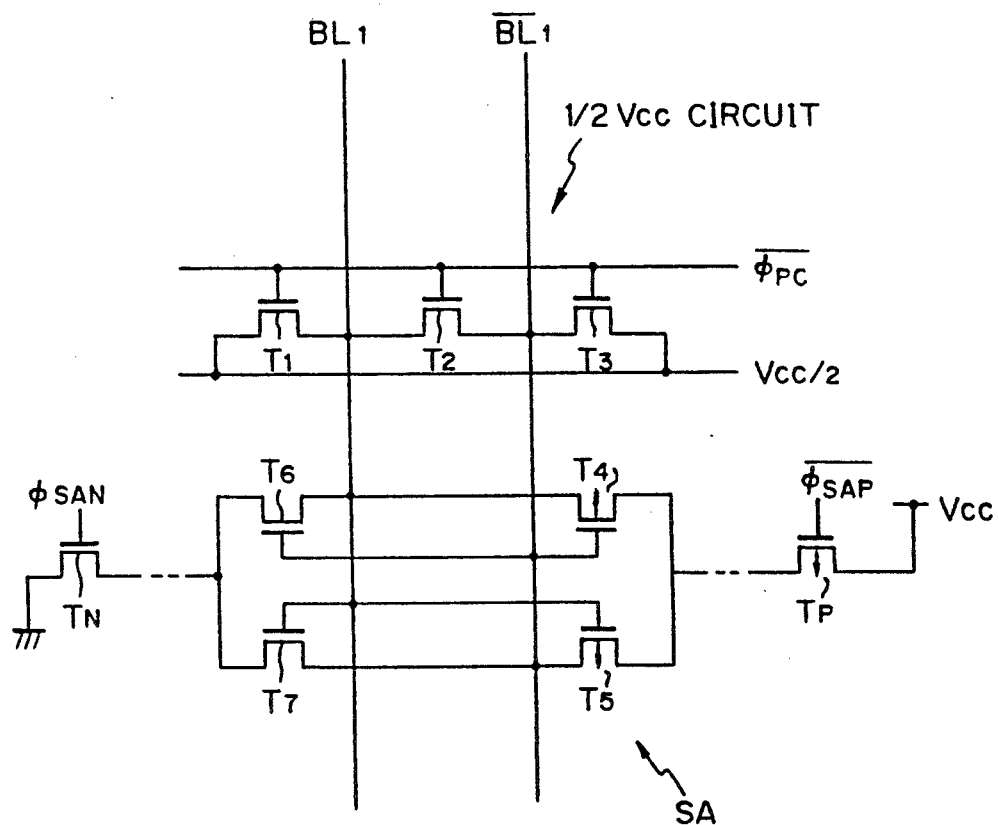

FIG. 9 shows an arrangement of the sense amplifier including a $\frac{1}{2} V_{cc}$ circuit as an example. The $\frac{1}{2} V_{cc}$ circuit includes transistors $T_1$ to $T_3$ which are operated in response to a precharge signal $\overline{\phi_{pc}}$ for presetting the potentials of bit lines $BL_1$ and $\overline{BL_1}$ at $\frac{1}{2} V_{cc}$. The sense amplifier SA includes P-channel transistors $T_4$ and $T_5$ and N-channel transistors $T_6$ and $T_7$, and amplifies a voltage difference between the bit lines $BL_1$ and $\overline{BL_1}$.

Figure 8:
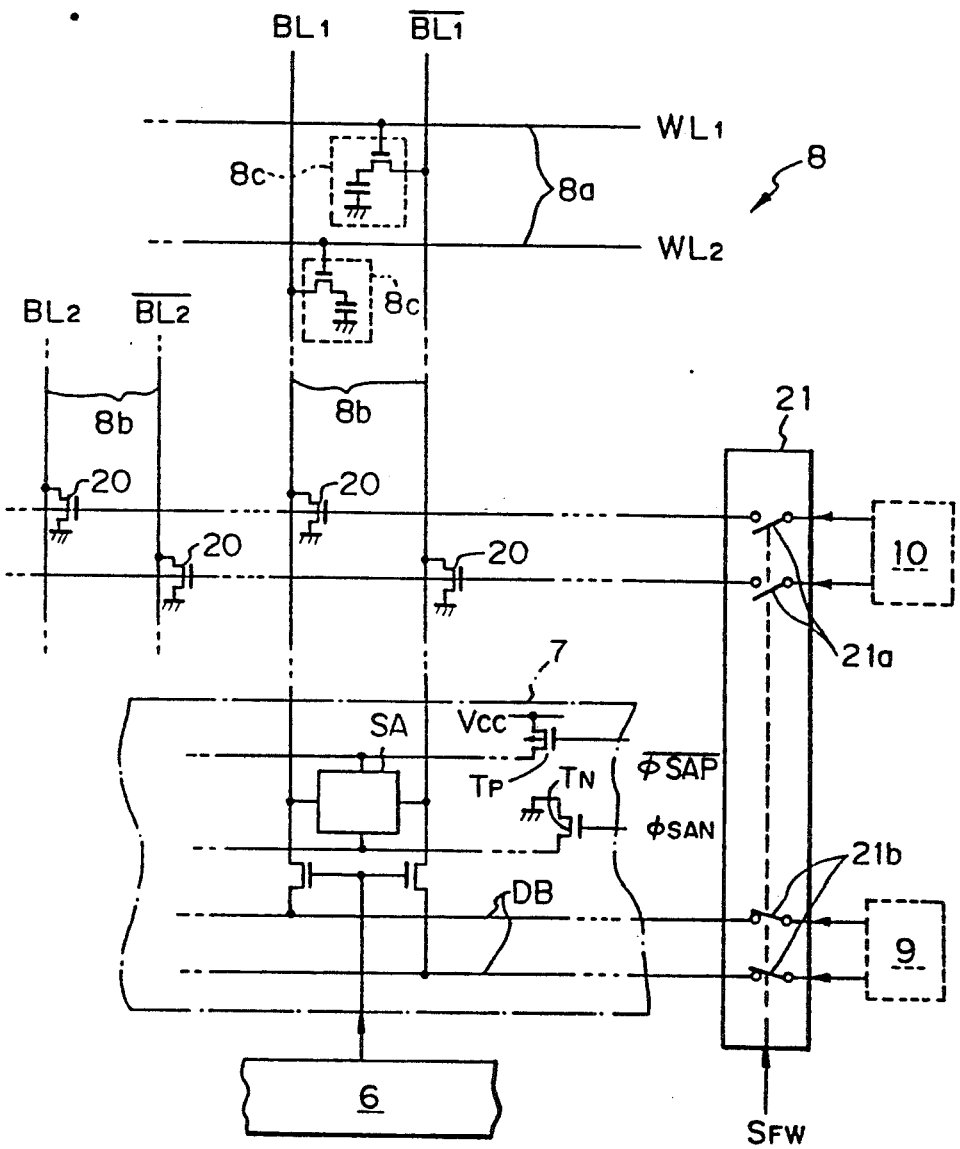

With the arrangement shown in FIGS. 8 and 9, in the flash write mode in which the signal $S_{FW}$ is input, the switching element 21a is turned ON at the same time as the switching element 21b is turned OFF, and each transistor 20 is operated in accordance with preset data from the flash write register 10. As a result, data in each memory cell 8c is updated in accordance with the preset data. According to this embodiment, a large modification of the sense amplifier & I/O gate 7, the column decoder 6, and the like, is not required.

Figure 10:
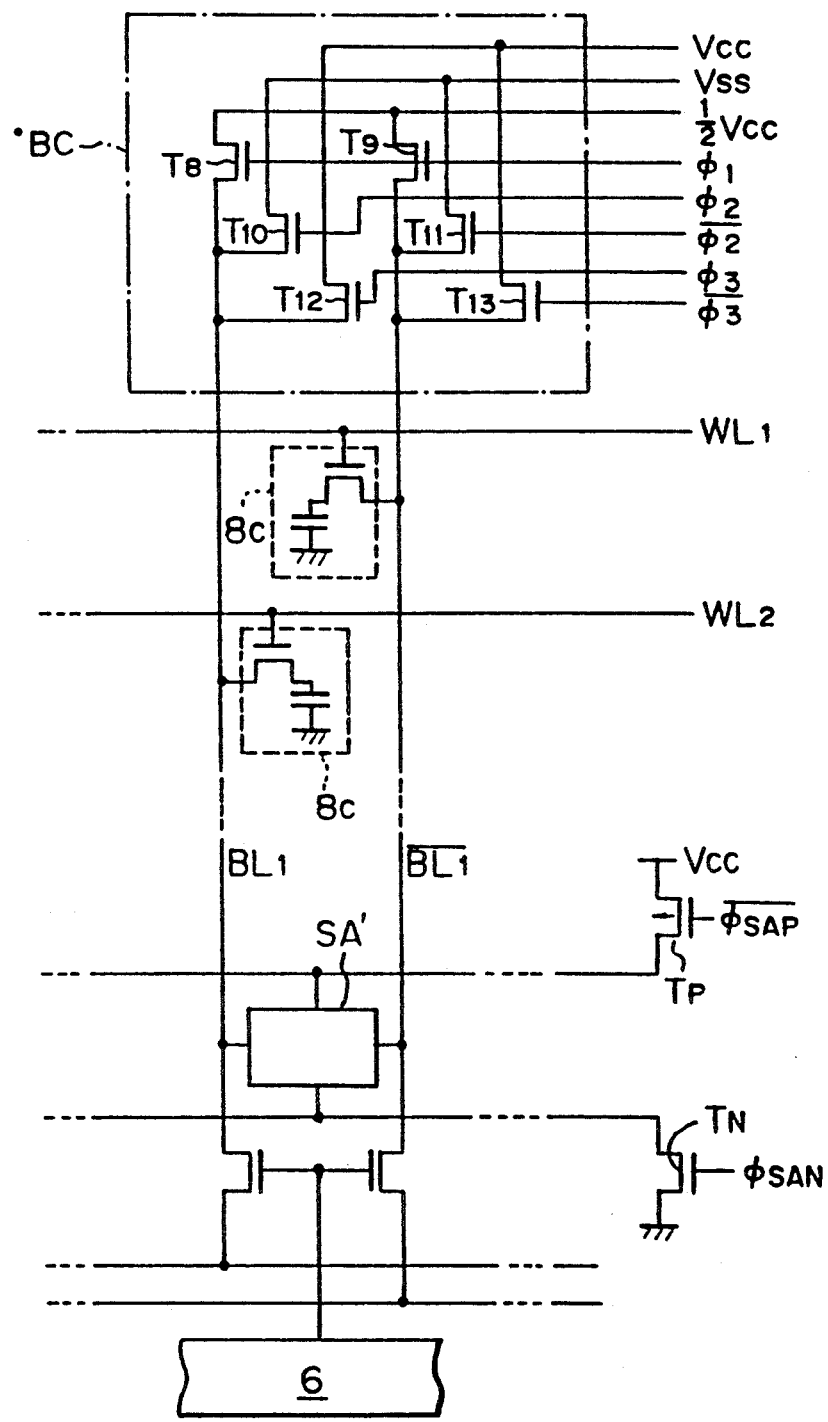
FIG. 10 is a circuit diagram showing an arrangement of a main part of a semiconductor memory device according to a third embodiment of the present invention.

FIG. 10 shows an arrangement of the main part of a third embodiment. Note that, in FIGS. 8 and 10, the same reference numerals denote the same parts. A bit line control circuit BC includes transistors $T_8$ and $T_9$ which are turned ON in response to a clock signal $\phi_1$, for connecting bit lines $BL_1$ and $\overline{BL_1}$ to a $\frac{1}{2} V_{cc}$ power source, transistors $T_{10}$ and $T_{11}$ which are turned ON in response to clock signals $\phi_2$ and $\overline{\phi_2}$ for connecting the bit lines $BL_1$ and $\overline{BL_1}$ to a $V_{ss}$ power source, and transistors $T_{12}$ and $T_{13}$ which are turned ON in response to clock signals $\phi_3$ and $\overline{\phi_3}$ for connecting the bit lines $BL_1$ and $\overline{BL_1}$ to a $V_{cc}$ power source.

The bit line controller BC resets the bit lines $BL_1$ and $\overline{BL_1}$ at $\frac{1}{2} V_{cc}$ level in response to the signal $\phi_1$ in a reset mode, and at this time, a sense amplifier SA' and the column decoder 6 are disabled. The sense amplifier SA' does not include a $\frac{1}{2} V_{cc}$ circuit shown in FIG. 8.

In a normal read mode, all of the signals $\phi_1$ to $\phi_3$ are disabled, a voltage difference between the bit lines $BL_1$ and $\overline{BL_1}$ is amplified by the sense amplifier SA', and the column decoder 6 is enabled so that the data is transferred to a data bus in a read mode.

In a flash write mode, after the above-mentioned reset operation, the bit lines $BL_1$ and $\overline{BL_1}$ are reset at the $V_{cc}$ or $V_{ss}$ level in response to the signal $\phi_2$ or $\phi_3$ and at this time, the column decoder 6 is still disabled. The sense amplifier SA' may remain disabled, or may be enabled to immediately reset the bit lines $BL_1$ and $\overline{BL_1}$.

Note that, although a dynamic RAM is exemplified in the above embodiments, the present invention is not limited thereto, and can be applied to any semiconductor memory device requiring reset operation.

According to the present invention, a word address signal required for a flash write mode can be generated inside the device. Therefore, an external address signal is not required, and thus a flash write external address circuit is not required, whereby an external circuit is simplified.

While the invention has been particularly shown and described in reference to preferred embodiments thereof, it will be understood by those skilled in the art that changes in form and details may be made therein without departing from the spirit and scope of the invention.

We claim:

1. A semiconductor memory device comprising:
   a plurality of word lines and bit lines;
   a plurality of memory cells connected between said work lines and said bit lines;
   flash write mode designating means for designating a flash write mode in accordance with external control signals;
   internal address generating means, connected to said flash write mode designating means and driven during a flash write mode, for sequentially generating internal address signals;
   word-line selecting means, connected to said internal address generating means, for sequentially selected the word lines in accordance with the internal address signals from said internal address generating means;
   preset data generating means for generating preset data; and
   write means, connected to said preset data generating means and driven during the flash write mode, for writing data from said preset data generating means into all memory cells connected to the word line selected by said work-line selecting means, wherein said internal address generating means has an input terminal for receiving said flash write mode signal and has output terminals for outputting said internal address signals to said word-line selecting means when said flash write mode signal is applied to said input terminal of said internal address generating means.

2. A semiconductor memory device as claimed in claim 1, wherein said flash write mode designating means is a control means having input terminals for receiving said external control signals and having an output terminal for providing a flash write mode signal to said internal address generating means when said control signals are in a predetermined state.

3. A semiconductor memory device as claimed in claim 2, wherein said write means comprises:
   flash write transistors each connected between a respective one of said bit lines and ground,
   switching means for selecting said preset data from said preset data generating means to be written into selected memory cells when said flash write mode signal is applied to said switching means and for selecting write data to be written into said memory cells when said flash write signal is not applied to said switching means.

4. A semiconductor memory device as claimed in claim 2, wherein said write means comprises:
   a bit line control circuit connected to said bit lines, including;
   first transistors which are turned ON in response to a first clock signal for connecting the bit lines to a first power source line;
   second transistors which are turned ON in response to a second clock signal for connecting the bit lines to a second power source line;
   third transistors which are turned ON in response to a third clock signal for connecting the bit lines to a third power source line;
   whereby, in a reset mode, the bit lines are reset to a voltage level of said first power source line which is one-half a voltage level of said third power source line in response to said first clock signal; and
   in a flash write mode, after said reset mode, said bit lines are reset at one of the voltage level of said third power supply line and a voltage level of said second power supply line in response to one of said third clock signal and said second clock signal, respectively.

5. A semiconductor memory device as claimed in claim 2, wherein said write means includes a column decoder for selecting all of said bit lines when said flash write mode signal is applied to said column decoder, whereby said preset data is written by said write means into memory cells connected between a selected word line and all of said bit lines.

6. A semiconductor memory device as claimed in claim 5, wherein said write means further comprises an input/output gate means for passing said preset data from said preset data generating means to selected memory cells.

7. A semiconductor memory device as claimed in claim 5, wherein said write means further comprises data switching means for selecting said preset data from said preset data generating means when said flash write mode signal is applied to said data switching means and for selecting write data when said flash write mode signal is not applied to said data switching means.

8. A semiconductor memory device as claimed in claim 2, wherein said control means has another output terminal for providing a refresh mode signal to said internal address generating means when said control signals are in another predetermined state, and said internal address generating means has another input terminal for receiving said refresh mode signal, said output terminals of said internal address generating means providing row address signals as said internal address signals when said refresh mode signal is applied to said another input terminal of said internal address generating means.

9. A semiconductor memory device as claimed in claim 8, further comprising:
   address input buffer means for receiving external address signals; and
   address switching means for switching its output between said external address signals from said address input buffer means and said internal address signals from said internal address generating means,
   wherein said control means has a discriminating means for discriminating whether an access mode is an external address access mode or an internal address access mode based on said external control signals,
   wherein, when said control means discriminates that the access mode is said internal address access mode, said address switching means selects said internal address signals from said internal address generating means as address signals to access said memory cells, and when said control means discriminates that the access mode is said external access mode, said address switching means selects said external address signals from said address input buffer means as the address signals to access said memory cells.

10. A semiconductor memory device as claimed in claim 9, wherein said address switching means comprises:
    an OR gate circuit for receiving one of said refresh mode signal and said flash write mode signal;
    a logic gate circuit having a first input connected to an output of said OR gate circuit and a second input for receiving an external flash write control signal;
    a first NAND gate for receiving an output of said logic gate circuit and one of said internal address signals;
    a second NAND gate circuit for receiving an inverted signal of said output signal from said logic gate circuit and one of said external address signals; and
    a third NAND gate circuit for receiving output signals from said first NAND gate circuit and said second NAND gate circuit.

11. A semiconductor memory device as claimed in claim 9, wherein said address switching means comprises:
    an OR gate circuit for receiving one of said refresh mode signal and said flash write mode signal;
    a first NAND gate circuit for receiving an output signal from said OR gate circuit and one of said internal address signals;
    a second NAND gate circuit for receiving an inverted signal of said output signal from said OR gate circuit and one of said external address signals; and
    a third NAND gate circuit for receiving output signals from said first NAND gate circuit and said second NAND gate circuit.

12. A semiconductor memory as claimed in claim 9, wherein said external control signals received by said control means include a column address strobe signal and a row address strobe signal, one of said flash write mode signal and said refresh mode signal being selectively generated in said internal address access mode when said column address strobe signal and said row address strobe signal have a first predetermined relationship, and not being generated in said external address access mode which exists when said column address strobe signal and said row address strobe signal have a second predetermined relationship.

13. A semiconductor memory device as claimed in claim 12, wherein said control means comprises a first flip flop for outputting said refresh mode signal when said column address strobe signal and said row address strobe signal have said first predetermined relationship and an external flash write control signal is at a first level, and comprises a second flip flop for outputting said flash write mode signal when said column address strobe signal and said row address strobe signal have said first predetermined relationship and said external flash write control signal is at a second level different from said first level.

14. A semiconductor memory device as claimed in claim 9, wherein said address switching means comprises:
    an OR gate circuit having a first input for receiving said refresh mode signal and a second input for receiving said flash write mode signal; and
    a switching gate circuit for selectively outputting said internal address signals or said external address signals depending on to an output signal of said OR gate circuit.

15. A semiconductor memory device as claimed in claim 14, wherein said address switching means further comprises a logic gate circuit for receiving an external flash write control signal and the output signal from said OR gate circuit, and output of said logic gate circuit being connected to an input of said switching gate circuit, whereby when said external flash write control signal is at a predetermined level, said switching gate circuit selects said external address signals to be outputted to said word line selecting means regardless of the level of said refresh mode signal or said flash write mode signal.

* * * * *